United States Patent
Yin et al.

(10) Patent No.: US 10,111,333 B2
(45) Date of Patent: Oct. 23, 2018

(54) MOLDED POWER-SUPPLY MODULE WITH BRIDGE INDUCTOR OVER OTHER COMPONENTS

(75) Inventors: Jian Yin, San Jose, CA (US); Matthew Harris, Raleigh, NC (US)

(73) Assignee: INTERSIL AMERICAS INC., Milpitas, CA (US)

( * ) Notice: Subject to any disclaimer, the term of this patent is extended or adjusted under 35 U.S.C. 154(b) by 332 days.

(21) Appl. No.: 13/042,332

(22) Filed: Mar. 7, 2011

(65) Prior Publication Data

US 2011/0228507 A1 Sep. 22, 2011

Related U.S. Application Data (60) Provisional application No. 61/314,536, filed on Mar. 16, 2010, provisional application No. 61/359,780, filed on Jun. 29, 2010.

(51) Int. Cl.
*H05K 7/02* (2006.01)
*H05K 1/18* (2006.01)
(Continued)

(52) U.S. Cl.
CPC ............. *H05K 1/18* (2013.01); *H01L 23/495* (2013.01); *H01L 23/49531* (2013.01);
(Continued)

(58) Field of Classification Search
CPC ..................... H05K 3/103; H05K 2201/10977
USPC ................. 257/787–796, 676, 678; 361/760, 361/763–766, 773–774, 782, 811, 729, 361/761; 174/260, 250, 251, 255
See application file for complete search history.

(56) References Cited

U.S. PATENT DOCUMENTS 5,220,489 A * 6/1993 Barreto et al. ................. 361/783
5,621,635 A * 4/1997 Takiar ............................ 363/141
(Continued)

FOREIGN PATENT DOCUMENTS

CN 1674276 9/2005
CN 101484995 A 7/2009
(Continued)

OTHER PUBLICATIONS

U.S. Appl. No. 13/035,792, entitled "Power Supply Module With Electromagnetic Interference (EMI) Shielding, Cooling, or Both Shielding and Cooling, Along Two or More Sides", filed Feb. 25, 2011, pp. 41.

(Continued)

*Primary Examiner* — Sherman Ng
(74) *Attorney, Agent, or Firm* — Foley & Lardner LLP (57) ABSTRACT

An embodiment of a power-supply module includes a molded package, power-supply components disposed within the package, and an inductor disposed within the package and over the power-supply components. For example, for a given output-power rating, such a power-supply module may be smaller, more efficient, and more reliable than, and may run cooler than, a power-supply module having the inductor mounted outside of the package or side-by-side with other components. And for a given size, such a module may have a higher output-power rating than a module having the inductor mounted outside of the package or side-by-side with other components.

19 Claims, 6 Drawing Sheets

(51) Int. Cl.
  *H01L 23/495* (2006.01)
  *H01L 23/64* (2006.01)
  *H01L 25/16* (2006.01)
  *H01F 27/06* (2006.01)
  *H05K 3/20* (2006.01)
  *H05K 3/28* (2006.01)
  *H01L 23/00* (2006.01)

(52) U.S. Cl.
  CPC ...... *H01L 23/49575* (2013.01); *H01L 23/645* (2013.01); *H01L 25/16* (2013.01); *H01F 2027/065* (2013.01); *H01L 24/48* (2013.01); *H01L 2224/48227* (2013.01); *H01L 2924/00014* (2013.01); *H01L 2924/1305* (2013.01); *H01L 2924/13091* (2013.01); *H01L 2924/14* (2013.01); *H01L 2924/181* (2013.01); *H01L 2924/19105* (2013.01); *H01L 2924/3025* (2013.01); *H05K 3/202* (2013.01); *H05K 3/284* (2013.01); *H05K 2201/1003* (2013.01); *H05K 2201/10166* (2013.01); *H05K 2201/10515* (2013.01); *H05K 2203/1327* (2013.01)

(56) References Cited

U.S. PATENT DOCUMENTS

| | | | |
|---|---|---|---|
| 5,757,074 A * | 5/1998 | Matloubian et al. | 257/702 |
| 6,049,469 A | 4/2000 | Hood, III et al. | |
| 6,274,937 B1 | 8/2001 | Ahn et al. | |
| 6,541,948 B1 | 4/2003 | Wong | |
| 6,885,278 B2 | 4/2005 | Nakao et al. | |
| 6,972,965 B2 | 12/2005 | Ravid et al. | |
| 7,087,976 B2 | 8/2006 | Gardner | |
| 7,166,493 B2 | 1/2007 | Dentry et al. | |
| 7,327,010 B2 | 2/2008 | Gardner | |
| 7,439,452 B2 * | 10/2008 | Masuda | 174/536 |
| 7,531,893 B2 | 5/2009 | Koduri | |
| 7,615,842 B2 | 11/2009 | Lee et al. | |
| 7,636,242 B2 | 12/2009 | Hazucha et al. | |
| 7,714,419 B2 | 5/2010 | Camacho et al. | |
| 7,808,087 B2 | 10/2010 | Zhao et al. | |
| 8,064,211 B2 | 11/2011 | Furukawa et al. | |
| 8,213,180 B2 | 7/2012 | Zhao et al. | |
| 8,264,059 B2 | 9/2012 | Kim et al. | |
| 2002/0017699 A1 | 2/2002 | Shenoy | |
| 2003/0031339 A1 * | 2/2003 | Marshall et al. | 381/400 |
| 2003/0209785 A1 * | 11/2003 | Choi et al. | 257/666 |
| 2004/0089955 A1 * | 5/2004 | Zhou | 257/787 |
| 2004/0178473 A1 | 9/2004 | Dentry et al. | |
| 2005/0007178 A1 * | 1/2005 | Fahim | 327/390 |
| 2005/0134420 A1 | 6/2005 | Nakao et al. | |
| 2005/0189636 A1 * | 9/2005 | Savastiouk et al. | 257/678 |
| 2006/0018098 A1 * | 1/2006 | Hill | H05K 1/0204 361/708 |
| 2006/0102994 A1 | 5/2006 | Pu et al. | |
| 2006/0108663 A1 * | 5/2006 | Sanzo et al. | 257/531 |
| 2007/0072340 A1 * | 3/2007 | Sanzo et al. | 438/106 |
| 2007/0090502 A1 | 4/2007 | Zhao et al. | |
| 2007/0114634 A1 | 5/2007 | Lin et al. | |
| 2007/0114651 A1 | 5/2007 | Marimuthu et al. | |
| 2007/0138594 A1 | 6/2007 | Lee et al. | |
| 2007/0152796 A1 | 7/2007 | He et al. | |
| 2007/0290362 A1 | 12/2007 | Hsu et al. | |
| 2008/0029907 A1 * | 2/2008 | Koduri | 257/784 |
| 2008/0036034 A1 * | 2/2008 | Juskey et al. | 257/531 |
| 2008/0180921 A1 * | 7/2008 | Chen et al. | 361/729 |
| 2008/0297138 A1 * | 12/2008 | Taylor et al. | 324/117 H |
| 2008/0303125 A1 * | 12/2008 | Chen et al. | 257/676 |
| 2009/0032927 A1 * | 2/2009 | Kim et al. | 257/686 |
| 2009/0127691 A1 | 5/2009 | Lee | |
| 2009/0134856 A1 * | 5/2009 | Rahman et al. | 323/282 |
| 2009/0160595 A1 | 6/2009 | Feng et al. | |
| 2009/0166822 A1 | 7/2009 | Camacho et al. | |
| 2009/0186453 A1 | 7/2009 | Koduri | |
| 2009/0207574 A1 * | 8/2009 | Chen et al. | 361/761 |
| 2009/0230519 A1 | 9/2009 | Otremba et al. | |
| 2010/0117243 A1 * | 5/2010 | Zaccardi | 257/777 |
| 2010/0133670 A1 | 6/2010 | Liu et al. | |
| 2010/0155836 A1 | 6/2010 | Herbert | |
| 2010/0155837 A1 | 6/2010 | Herbert | |
| 2010/0155915 A1 | 6/2010 | Bell et al. | |
| 2010/0276752 A1 | 11/2010 | Herbert | |
| 2011/0049693 A1 | 3/2011 | Nakashiba et al. | |
| 2011/0057106 A1 | 3/2011 | Kimura et al. | |
| 2011/0228507 A1 | 9/2011 | Yin et al. | |
| 2012/0273932 A1 | 11/2012 | Mao et al. | |

FOREIGN PATENT DOCUMENTS

| | | |
|---|---|---|
| CN | 102254908 | 11/2011 |
| CN | 102447382 | 5/2012 |
| JP | 2004063676 | 2/2004 |
| JP | 2004289912 | 10/2004 |
| JP | 2005123535 | 5/2005 |
| JP | 2008017540 | 1/2008 |
| JP | 2008060426 | 3/2008 |
| JP | 2009038950 | 2/2009 |
| JP | 2010056463 | 3/2010 |
| JP | 2010129877 | 6/2010 |
| JP | 2011193000 | 9/2011 |
| JP | 2007318954 | 12/2012 |
| JP | 2015122507 | 7/2015 |
| KR | 100275541 | 1/2001 |
| KR | 100662848 | 12/2006 |
| TW | 201205767 | 2/2012 |
| TW | 201230294 | 7/2012 |
| WO | 03/021667 | 3/2003 |
| WO | 2008/003008 | 1/2008 |
| WO | 2008/011459 A2 | 1/2008 |
| WO | 2008/011459 A3 | 1/2008 |
| WO | 2009/067265 | 5/2009 |

OTHER PUBLICATIONS

State Intellectual Property Office of the People's Republic of China, "Notice on Grant of Patent Right CN Application No. 201110105798.2", "Foreign Counterpart to U.S. Appl. No.", dated Feb. 2, 2016, pp. 1-2, Published in: CN.

Japanese Patent Office, "Final Office Action for JP Patent Application No. 2014-265316", "from Foreign counterpart of U.S. Appl. No. 13/042,332", dated Aug. 9, 2016, pp. 1-2, Published in: JP.

Japan Patent Office, "Notice of Allowance", "from U.S. Appl. No. 13/035,792", dated Nov. 29, 2016, pp. 1-4, Published in: JP.

Japan Patent Office, "Notification of Reason(s) for Refusal JP Application No. 2014-265316", "Foreign counterpart to U.S. Appl. No.", dated Apr. 12, 2016, pp. 1-5, Published in: JP.

The Patent Office of the State Intellectual Property Office of the People's Republic of China, "Decision on Rejection", "Foreign Counterpart to U.S. Appl. No. 13/035,792", dated Mar. 2, 2017, pp. 1-10, Published in: CN.

State Intellectual Property Office of the People's Republic of China, "Third Office Action from Chinese application No. 201110285670.9", dated Mar. 4, 2016, pp. 1-10, Published in: CN.

State Intellectual Property Office of the People'S Republic of China, "Office Action for CN patent Application No. 201110285670.9", "from Foreign Counterpart of U.S. Appl. No. 13/035,792", dated Sep. 5, 2016, pp. 1-8, Published in: CN.

United States Patent and Trademark Office, "Final Office Action", "from U.S. Appl. No. 13/035,792", dated Sep. 11, 2014, pp. 1-12, Published in: US.

United States Patent and Trademark Office, "Final Office Action", "from U.S. Appl. No. 13/035,792", dated Apr. 21, 2016, pp. 1-13, Published in: US.

United States Patent and Trademark Office, "Notice of Allowance", "From U.S. Appl. No. 13/035,792", dated Aug. 10, 2016, pp. 1-15, Published in: US.

United States Patent and Trademark Office, "Office Action", "from U.S. Appl. No. 13/035,792", dated Jun. 5, 2015, pp. 1-13, Published in: US.

(56) References Cited

OTHER PUBLICATIONS

Taiwan Intellectual Property Office, "Office Action from TW Application No. 104117620 dated May 9, 2016", "from Foreign Counterpart of U.S. Appl. No. 13/042,332", dated May 9, 2016, pp. 1-17, Published in: TW.

* cited by examiner

MOLDED POWER-SUPPLY MODULE WITH BRIDGE INDUCTOR OVER OTHER COMPONENTS

CLAIM OF PRIORITY

The present application claims the benefit of U.S. Provisional Patent Application Ser. No. 61/314,536 filed on Mar. 16, 2010; the present application also claims the benefit of U.S. Provisional Patent Application Ser. No. 61/359,780 filed on Jun. 29, 2010; all of the foregoing applications are incorporated herein by reference in their entireties.

RELATED APPLICATION DATA

This application is related to U.S. patent application Ser. No. 13/035,792 entitled POWER-SUPPLY MODULE WITH ELECTROMAGNETIC-INTERFERENCE (EMI) SHIELDING, COOLING, OR BOTH SHIELDING AND COOLING, ALONG TWO OR MORE SIDES filed on Feb. 25, 2011, which application is incorporated herein by reference in its entirety.

SUMMARY

An embodiment of a power-supply module includes a package, power-supply components disposed within the package, and an inductor disposed within the package and over the power-supply components. For example, for a given output-power rating, such a power-supply module may be smaller, more efficient, and more reliable than, and may run cooler than, a power-supply module having the inductor mounted outside of the package or side-by-side with other components. And for a given size, such a module may have a higher output-power rating than a module having the inductor mounted outside of the package or side-by-side with other components.

DETAILED DESCRIPTION

One or more embodiments are described with reference to the drawings, wherein like reference numerals may be used to refer to like elements throughout. In the following description, for purposes of explanation, numerous specific details are set forth in order to provide a thorough understanding of the one or more embodiments. It may be evident, however, that one or more embodiments may be practiced without these specific details. In other instances, well-known structures and devices are shown in block diagram form in order to facilitate describing one or more embodiments.

Figure 1:
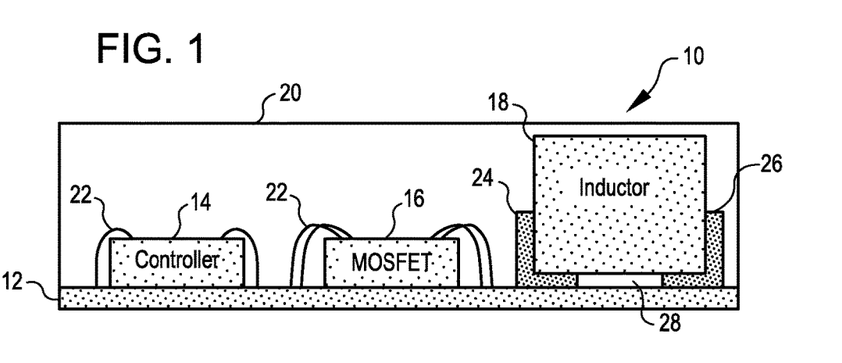
FIG. 1 is a cutaway side view of a power-supply module having an inductor mounted side-by-side with other components.

FIG. 1 is a cutaway side view of a switching-power-supply module 10, which may be used to power an integrated circuit or other device (not shown in FIG. 1), and which may include most or all of the power-supply components such that few, if any, discrete components of the power supply need be mounted to a printed circuit board (not shown in FIG. 1) to which the module is mounted. Consequently, such a module may reduce the layout area, assembly complexity, component count, and cost of a system in which the module 10 is incorporated.

The power-supply module 10 includes a platform 12, a controller 14 mounted to the platform, MOSFET transistors 16 mounted to the platform, one or more inductors 18 mounted to the platform, and a package 20 that encapsulates at least part of the platform, the controller, transistors, and inductor(s).

The platform 12 may be a printed circuit board, lead frame, BT substrate, or any other suitable platform.

The controller 14 may be any suitable power-supply controller, or other controller adapted or programmed to control a power supply. Leads or pads (not shown) beneath the controller 14 may electrically couple the controller to conductive pads of the platform 12. Or, the controller 14 may include top leads or pads that are wire bonded with wires 22 to conductive pads of the platform 12. The controller 14 may also include both underneath pads/leads and top pads/leads. The controller 14 may be in die form, or may be at least partially encapsulated by a package that is separate from the module package 20. Furthermore, the controller 14 may be in contact with the platform 12, or there may be a thermally conductive substance (e.g., a thermally conductive grease) between the controller and the platform, to facilitate heat transfer from the controller to the platform so as to facilitate the cooling of the controller via the platform.

The transistors 16 may include high-side and low-side switching transistors for driving one or more phases of the power supply. For example, the module 10 may include a pair of transistors 16, a high-side transistor and a low-side transistor, for each phase. The transistors 16 may be in die form, or may be at least partially encapsulated (individually, in groups, or all together) by one or more packages that are separate from the module package 20. The transistors 16 may be in contact with the platform 12, or there may be a thermally conductive substance between the transistors and the platform, to facilitate heat transfer from the transistors to the platform so as to facilitate the cooling of the transistors. The transistors 16 may have pads on the bottom for electrical contact to pads of the platform 12, or the transistors may have pads on the top that are wire bonded to pads of the platform with wires 22. And the transistors 16 may also include both underneath pads/leads and top pads/leads.

The one or more inductors 18 may include the power-supply-phase inductor(s), and an optional filter inductor. The inductor(s) 18 may be at least partially encapsulated (individually, in groups, or all together) by one or more packages that are separate from the module package 20 to form one or more inductor modules, or the inductor(s) may be unpackaged. Leads 24 and 26, which may be made from a suitably conductive material such as copper or aluminum, may electrically and thermally couple the inductor(s) 18 to conductive pads of the platform 12 to keep the inductor(s) cool.

Furthermore, a thermally conductive material may be disposed in a space 28 between the inductor(s) 18 and the platform 12.

The package 20 may be formed from any suitable material such as an epoxy resin, may completely cover the controller 14, transistors 16, and inductor(s) 18, and may completely cover the platform 12, or may leave portions of the platform exposed, for example, the bottom portion of the platform having pads or leads that allow external electrical connections to the controller, transistors, inductor(s), and possibly other module components. Furthermore, the package 20 may be solid such that it fills in most to all unoccupied spaces (e.g., spaces within the boundaries of the package unoccupied by the controller 14, transistors 16, inductor(s) 18, and possibly other power-supply components) so that there are few or no voids within the module.

A problem with the module 10, however, is that it has a relatively inefficient layout, and, thus, may have a relatively large size for a given output-power rating, because there is a significant amount of unoccupied space (e.g., above the controller 14 and transistors 16) within the package 20. Furthermore, the inefficient layout may result in relatively poor heat transfer from the internal components to outside of the package, and, thus, may cause the module 10 to run relatively "hot."

Another problem with the module 10 is that for a given module size, the inductor(s) 18 is(are) relatively small. Per above, the relatively inefficient layout of the module 10 limits the space that is available for the inductor(s) 18. A smaller inductor 18 may result in a higher power-supply switching frequency, and, thus, may result in higher power losses in the switches. Furthermore, a smaller inductor 18 may have a relatively thin winding with a relatively high resistance, and, thus, may result in higher $I^2R$ losses through the inductor. Consequently, a smaller inductor 18 may result in a lower overall power-conversion efficiency and in a higher heat output for the module 10. And a smaller inductor 18 may also result in a relatively large ripple amplitude superimposed on the regulated output voltage generated by the module 10.

Figure 2:
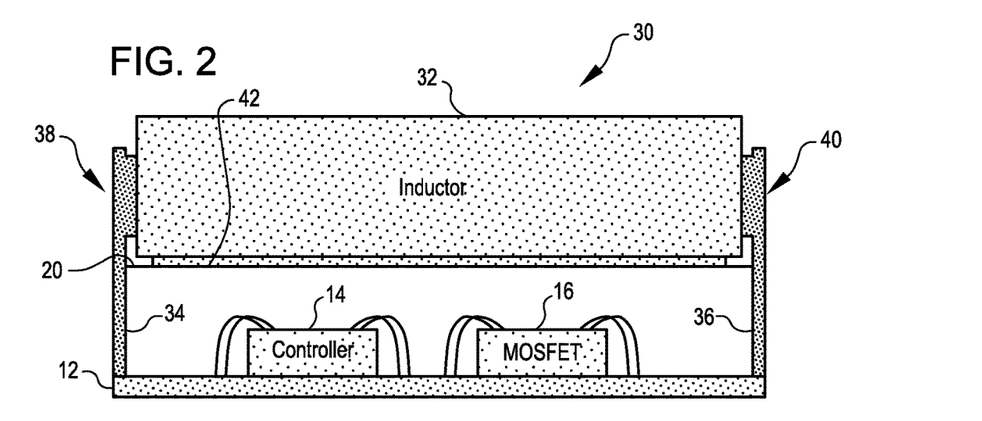
FIG. 2 is a cutaway side view of a power-supply module having an inductor mounted over the module package.

FIG. 2 is a cutaway side view of a switching-power-supply module 30, which may be used to power an integrated circuit or other device (not shown in FIG. 2), and which may, like the module 10 of FIG. 1, include most or all of the power-supply components such that few, if any, discrete components of the power supply need be mounted to a printed circuit board (not shown in FIG. 2) to which the module is mounted.

Like the power-supply module 10 of FIG. 1, the power-supply module 30 includes the platform 12, controller 14, MOSFET transistors 16, and package 20, which encapsulates at least part of the platform, the controller, and the transistors. But unlike the module 10, the module 30 includes one or more inductors 32 that are mounted over the controller 14, transistors 16, and package 20.

Each inductor 32 is supported by the package 20 (sometimes called the module body) and includes conductive leads 34 and 36, which are mounted to respective edges of the platform 12, and which are attached to respective sides of the inductor with respective weld or solder joints 38 and 40. And like the inductor(s) 18 of FIG. 1, the inductor(s) 32 may be at least partially encapsulated (individually, in groups, or all together) with one or more packages that are separate from the package 20, or may be unpackaged.

Furthermore, a thermally conductive material 42 (e.g., an adhesive or grease) may be disposed between each inductor 32 and the package 20 to attach the inductor to the package or to facilitate heat transfer between the inductor and the package.

Although mounting the inductor(s) 32 over other components (e.g., the controller 14 and transistors 16) may increase the layout efficiency of the module 30 and may allow the inductor(s) to be larger for a given module size (or may allow the module to be smaller for a given inductor size), mounting the inductor(s) outside of the package 20 may increase the assembly complexity and cost of the module, may limit the number of applications in which the module may be used, and may decrease the reliability of the module. For example, mounting the inductor(s) 32 outside of the package 20 may allow the inductor(s) to vibrate. Such a vibration may cause an audible hum that may render the module 30 unsuitable for use in "quiet" applications. Furthermore, such a vibration may, over time, cause the module 30 to malfunction by, e.g., breaking one or more of the weld joints 38 and 40. In addition, mounting the inductor(s) 32 outside of the package 20 may make the module 30 too tall for some applications.

Figure 3A:
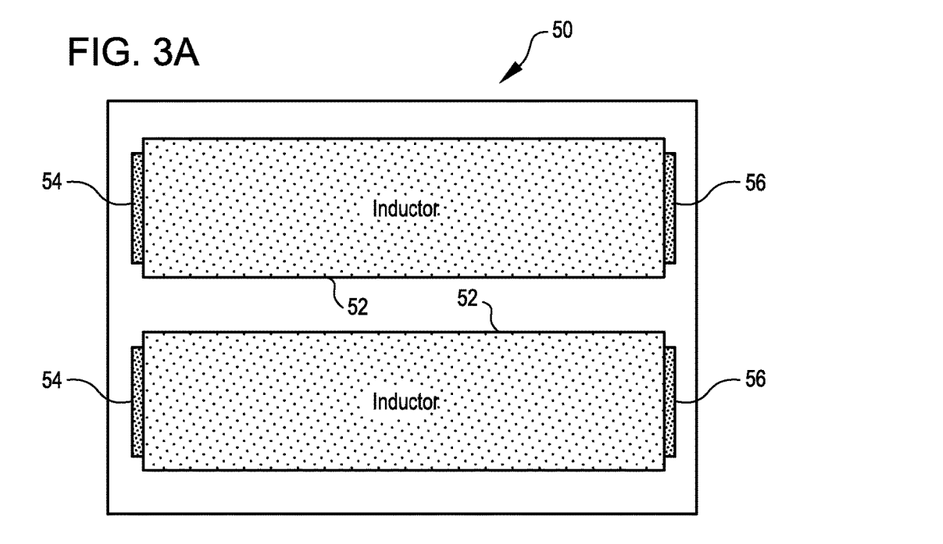
FIGS. 3A-3B are cutaway plan and side views, respectively, of an embodiment of a power-supply module having an inductor mounted inside of the module package and over other module components.
Figure 3B:
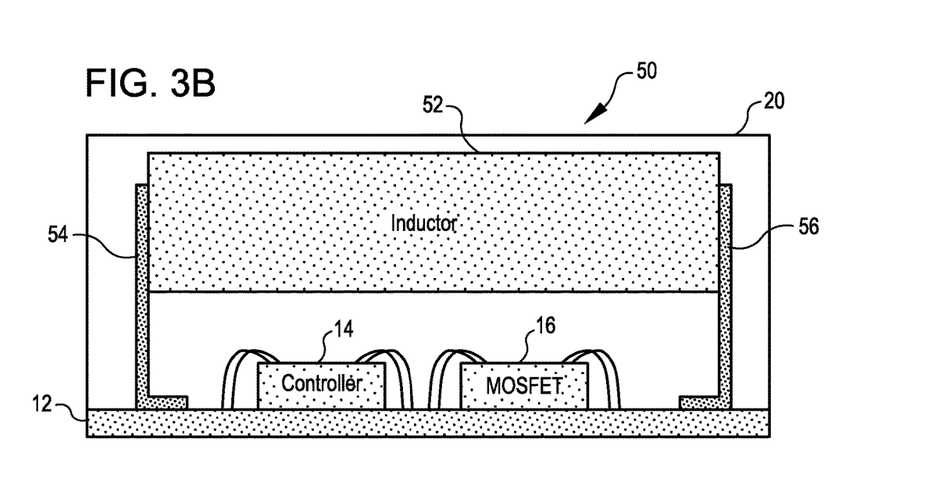

FIGS. 3A and 3B are cutaway plan and side views, respectively, of an embodiment of a power-supply module 50, which may overcome some or all of the problems discussed above in conjunction with the modules 10 and 30 of FIGS. 1-2. Like the modules 10 and 30, the module 50 may be used to power an integrated circuit or other device (not shown in FIGS. 3A-3B), and may include most or all of the power-supply components such that few, if any, discrete components of the power supply need be mounted to a printed circuit board or other platform (not shown in FIGS. 3A-3B) to which the module 50 is mounted.

Like the power-supply modules 10 and 30 of FIGS. 1 and 2, the power-supply module 50 includes the platform 12, controller 14, MOSFET transistors 16, and package 20, which encapsulates at least part of the platform, the controller, and the transistors. But unlike the modules 10 and 30, the module 50 includes one or more inductors 52, sometimes called bridge inductors (two inductors shown in FIG. 3A), that are mounted over the controller 14 and transistors 16 (and possibly over other components not shown in FIGS. 3A-3B) and that are disposed within the package 20.

Each inductor 52 includes leads 54 and 56, which are mounted to respective edges of the platform 12. Like the inductors 18 and 32 of FIGS. 1-2, the inductor(s) 52 may be at least partially encapsulated (individually, in groups, or all together) with one or more packages that are separate from the package 20, or may be unpackaged. The leads 54 and 56 support each inductor 52 over the controller 14 and transistors 16, and electrically couple each inductor to respective pads of the platform 12. The leads 54 and 56 may be attached to the inductor in a conventional manner, or may be extensions of the one or more windings that form the inductor. The leads 54 and 56 may be made of a low-resistance material (e.g., copper), and may be made relatively wide, to further reduce their resistances. For example, the leads 54 and 56 may be relatively rigid flat-ribbon wire leads that are made from copper.

As discussed above in conjunction with FIG. 2, mounting the inductor(s) 52 over other components (e.g., the controller 14 and transistors 16) may increase the layout efficiency of the module 50 and may allow the inductor(s) to be larger for a given module size. For example, for a given power output, mounting the inductor(s) 52 over the other module components may allow the footprint of the module 50 to be up to approximately 50% smaller than the footprint of the module 10. Furthermore, for a given module size, allowing the inductor(s) 52 to be larger may increase the efficiency and output-power rating of the module 50, and may also allow a reduction in the amplitude of the output-ripple voltage. As discussed above in conjunction with FIG. 2, a larger inductor may increase the efficiency and power rating of the module 50 by allowing a reduction in the switching frequency, and, thus, in the switching losses, and by allowing a reduction in the inductor-winding resistance, and, thus, in the $I^2R$ losses. For these same reasons, a larger inductor may reduce the heat generated by the module 50 for a given load current, and may thus allow the module to provide a higher load current for a given heat-dissipation rating.

Furthermore, mounting the inductor(s) 52 inside of the package 20 may reduce the assembly complexity and cost of the module, may expand the number of applications in which the module may be used, and may increase the reliability of the module. For example, mounting the inductor(s) 52 inside of the package 20 may reduce assembly costs of the module 50. Moreover, mounting the inductor(s) 52 inside of the package 20 may reduce or eliminate inductor vibration, and, thus, may increase the reliability of the inductor connections and may allow the module 50 to be used in "quiet" applications. In addition, mounting the inductor(s) 52 inside of the package 20 may reduce the height of the module 50, and thus make the module more suitable for low-clearance applications. For example, an embodiment of the module 50 may have the approximate dimensions (W×L×H) 17 millimeters (mm)×17 mm×7.5 mm, and, more generally, may have dimensions in the approximate range of 4 mm×4 mm×2 mm-25 mm×25 mm×10 mm.

Moreover, mounting the inductor(s) 52 near a side (here the top) of the package 20 may facilitate cooling of the module 50, particularly because the inductor(s) may be among the hottest components during operation of the module.

Still referring to FIGS. 3A-3B, an embodiment of a method for manufacturing the module 50 is described.

First, the controller 14, transistors 16, and any other components of the module 50 are mounted to the platform 12, the bottom pads of the components are soldered to corresponding pads of the platform.

Next, the upper pads (if any are present) of the components are wire bonded to corresponding pads of the platform 12.

Then, the leads 54 and 56 of the inductor(s) 52 are shaped, and the inductor(s) is(are) mounted to the platform 12, e.g., by soldering the leads to corresponding pads of the platform.

Next, the package 20 is formed, for example, by injection molding of epoxy resin.

Then, the leads (not shown in FIGS. 3A-3B) of the module 50 are shaped, and the module may be tested and shipped to customers.

Still referring to FIGS. 3A-3B, alternate embodiments of the power-supply module 50 are contemplated. For example, embodiments described above in conjunction with the modules 10 and 30 of FIGS. 1 and 2 may be applicable to the module 50. Furthermore, the controller 14, transistors 16, inductor(s) 52, and other components may or may not be packaged (e.g., with a material similar to that used to form the package 20) before being assembled into the module 50. Moreover, the package 20 may only partially cover the inductor(s) 52. For example, the inductor(s) 52 may extend past the top of the package 20. In addition, although described as being MOSFET transistors, the transistors 16 may be bipolar, IGBJT, or any other suitable type of transistor, or diodes may be used in place of, or in addition to, some of the transistors (e.g., the low-side transistors). Furthermore, although two inductors 52 are shown in FIG. 3A, the module 50 may include more or fewer than two inductors. Moreover, the module 50 may include components, such as one or more filter capacitors, feedback circuitry, compensation circuitry, and signal-value-set circuitry, in addition to the controller 14, transistors 16, and inductor(s) 52. In addition, the module 50 may omit any one or more of the controller 14, transistors 16, and inductor(s) 52. Furthermore, a heat sink may be attached to one or more sides (e.g., the top) of the module 50 to facilitate cooling of the module. Moreover, although shown bent inward at the platform 12, one or both of the leads 54 and 56 may be bent outward, sideward, or may not be bent at all. In addition, each inductor 52 may have more or fewer than the two leads 54 and 56. Furthermore, the inductors 52 need not be uniform from inductor to inductor, may be wound about a common core or about respective cores, may be packaged (before the package 20 is formed) together or separately, and may be magnetically coupled or uncoupled. Moreover, the module 50 may include mounts separate from the leads 54 and 56 for supporting the inductor(s) 52 over the other components.

Figure 4:
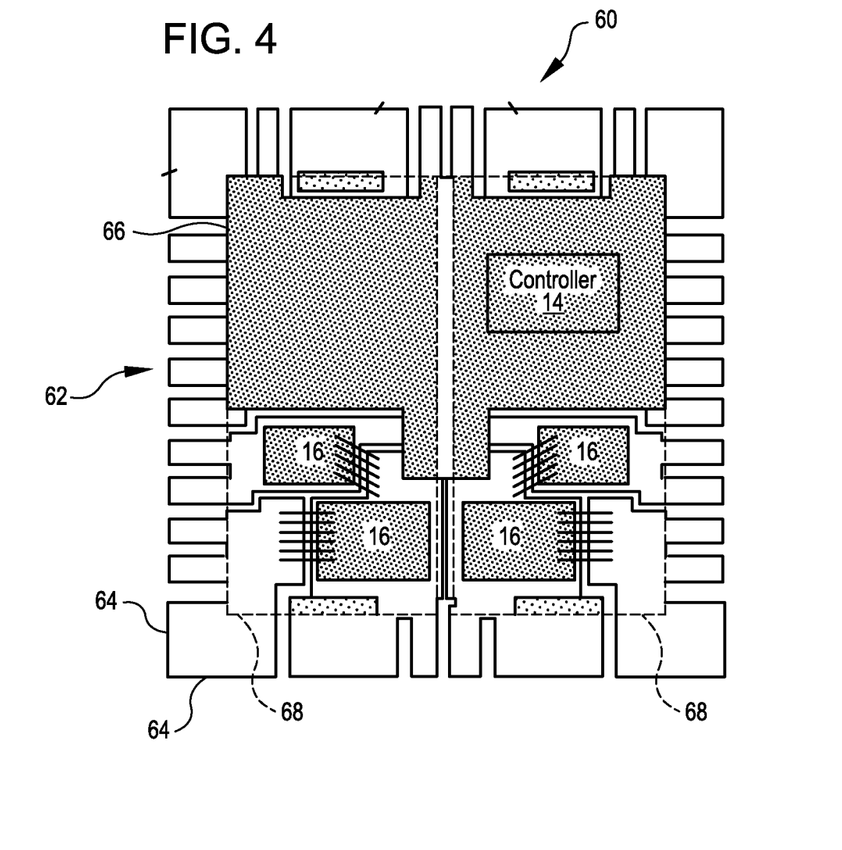
FIG. 4 is a cutaway plan view of another embodiment of a power-supply module having an inductor mounted inside of the module package and over other module components.

FIG. 4 is a cutaway plan view of an embodiment of a power-supply module 60, which may overcome all of the problems discussed above in conjunction with the modules 10 and 30 of FIGS. 1-2. Like the modules 10, 30, and 50, the module 60 may be used to power an integrated circuit or other device (not shown in FIG. 4), and may include most or all of the power-supply components such that few, if any, discrete components of the power supply need be mounted to a printed circuit board or other platform (not shown in FIG. 4) to which the module 60 is mounted.

The power-supply module 60 includes a platform 62, which includes a lead frame 64 and a printed circuit board 66 mounted to the lead frame, controller 14, MOSFET transistors 16, one or more inductors 68 (here two inductors shown in dashed line), and package 20, which encapsulates at least part of the platform, the controller, the transistors, and the inductor(s).

The lead frame 64 may be any suitable lead frame, and may be made from any suitable conductive material such as metal.

The printed circuit board 66 is disposed over a portion of the lead frame 64 to form the platform 62; this structure of the platform allows some components (e.g., components with many connections that produce a relatively small amount of heat) to be mounted to the circuit board, and other components (e.g., components with fewer connections but that produce a relatively large amount of heat) to be mounted directly to the lead frame for better heat transfer. The printed circuit board 66 may be mounted to the lead frame 64 in a conventional manner, and a thermally conductive material (e.g., thermal grease) may be disposed between the circuit board and the lead frame to improve heat transfer.

The controller 14, which may have a significant number of connection pads, but which may generate a relatively small amount of heat, is mounted to the printed circuit board 66.

The transistors 16, which may have relatively few connection pads, but which may generate relatively large amounts of heat, are mounted directly to the lead frame 64 to facilitate the transfer of heat from the transistors to the outside of the module 60. In an embodiment, there are four transistors 16: two high-side transistors and two low-side transistors. The low-side transistors are larger than the high-side transistors because in an embodiment, the low-side transistors conduct a higher average phase current than the high-side transistors conduct during steady-state operation. That is, the low-side transistors are typically on for a larger portion of each switching cycle than the high-side transistors.

Each inductor 68, which may be similar to the inductor(s) 52 of FIGS. 3A-3B, is mounted to the lead frame 64 over the printed circuit board 66, controller 14, transistors 16, and possibly other components (not shown) of the module 60.

The module 60 may provide one or more improvements that are similar to the improvements discussed above in conjunction with the module 50 of FIGS. 3A-3B, and the module 60 may be manufactured in a manner similar to that described above for the module 50, with an additional step of mounting the printed circuit board 66 to the lead frame 64.

Still referring to FIG. 4, alternate embodiments of the power-supply module 60 are contemplated. For example, embodiments described above in conjunction with the modules 10, 30, and 50 of FIGS. 1-3B may be applicable to the module 60. Furthermore, although shown disposed over a portion of the lead frame 64, the printed circuit board 66 may be disposed over the entire lead frame. Moreover, components (e.g., the transistors 16) described as being mounted to the lead frame 64 may instead be mounted to the printed circuit board 66, and components (e.g., the controller 14) described as being mounted to the printed circuit board may instead be mounted to the lead frame. In addition, the printed circuit board 66 may be omitted, and all of the components may be mounted directly to the lead frame 64; alternatively, the lead frame may be omitted and all of the components may be mounted directly to the printed circuit board.

Figure 5:
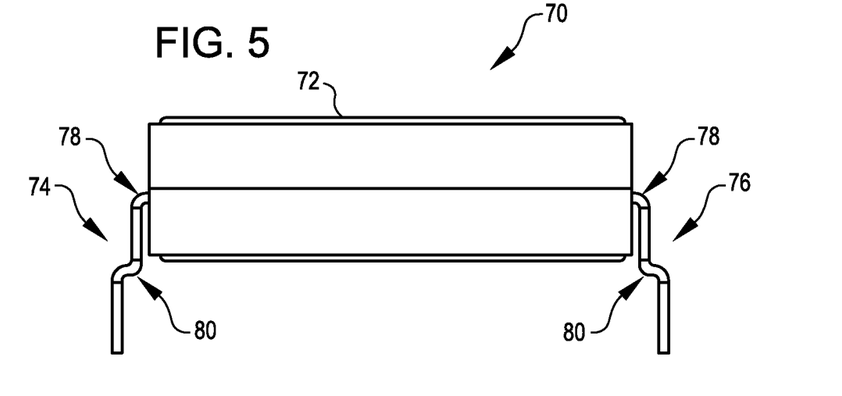
FIG. 5 is a side view of an embodiment of an inductor that may be used in the power-supply modules of FIGS. 3A-4.

FIG. 5 is a cutaway side view of an embodiment of an inductor 70, which may be used in the power-supply modules 50 and 60 of FIGS. 3A-4 in place of, or in addition to, the inductors 52 and 68.

The inductor 70 has a package 72 (which is separate from the package 20 of the modules 50 and 60), and has leads 74 and 76, which are extensions of the inductor winding and which each have two bends 78 and 80. For example, the angles of the bends 78 and 80 may be between approximately 30 and 90 degrees. Furthermore, although not shown, the bottoms of the leads 74 and 76 may also be bent at an approximately 90 degree angle to increase the mounting stability of the inductor 70. Moreover, although only two leads 74 and 76 are shown, the inductor 70 may have more than two leads (e.g., four leads), to increase the mounting stability of the inductor, to reduce the lead resistance, etc.

Still referring to FIG. 5, alternate embodiments of the inductor 70 are contemplated. For example, embodiments described above in conjunction with the inductors 18, 32, 52, and 68 of FIGS. 1-4 may be applicable to the inductor 70.

Figure 6:
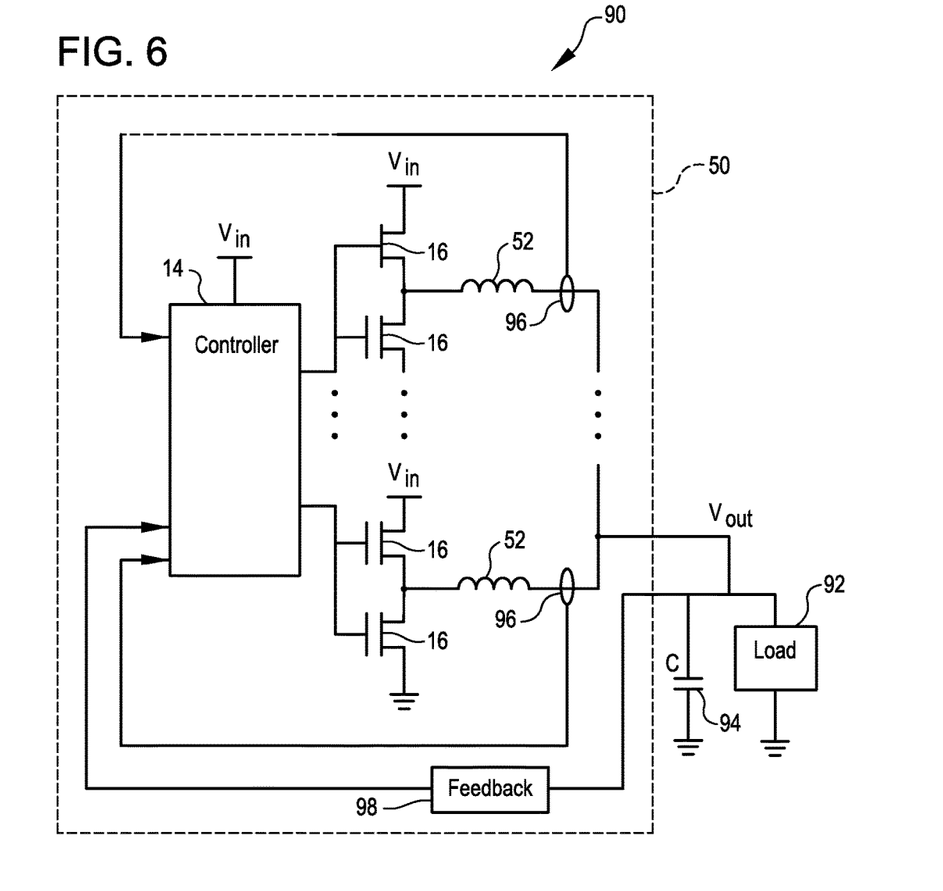
FIG. 6 is a schematic diagram of an embodiment of a system that incorporates one of the power-supply modules of FIGS. 3A-4.

FIG. 6 is a schematic diagram of an embodiment of a system 90, which may incorporate one or more embodiments of the power-supply modules 50 and 60 of FIGS. 3A-4. For purposes of explanation, however, the system 90 is discussed as incorporating an embodiment of the module 50 of FIGS. 3A-3B, where the module 50 includes a buck converter.

In addition to the module 50, the system 90 includes a load 92, which receives a regulated voltage Vout from the module, and a filter capacitor (C) 94. Examples of the load 92 include an integrated circuit such as a processor or memory.

Furthermore, the module 50 may include phase-current sensors 96 and a feedback circuit 98. The components that compose the sensors 96 and circuit 98 may be mounted to the platform 12 (FIG. 3B) beneath the inductor(s) 52.

In operation, the controller 14 controls the transistors 16 in response to the current sensors 96 and feedback circuit 98 to alternately couple an input voltage Vin and reference voltage (e.g., ground) to the phase inductor(s) 52 in a manner that generates the regulated voltage Vout from Vin. The current sensors 96 may allow the controller 14 to balance the load current among the phases (each phase includes a respective hi-low pair of the transistors 16 and a respective phase inductor 52), and may also allow the controller to detect and limit an over current to the load 92 (for example, if the load is short circuited).

Still referring to FIG. 6, alternate embodiments of the system 90 are contemplated. For example, embodiments described above in conjunction with FIGS. 1-5 may be applicable to the system 90. Furthermore, although described as a buck converter, the module 50 may include any other type of power supply such as a buck-boost converter. Moreover, the module 50 may include additional components such as a filter inductor coupled between the phase inductors 52 and the load 92. In addition, although described as being external to the module 50, the filter capacitor 94 may be part of the module.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A power supply module, comprising:
a platform having a side;
a package disposed over the platform;
power supply components disposed within the package, disposed over the side of the platform, and attached to the platform; and
an inductor structure having an inductor body disposed within the package, disposed over the side of the platform, and disposed over the power supply components, the inductor structure also having an inductor disposed within the inductor body and having inductor leads attached to the inductor body and attached to the platform, wherein:
the platform includes a lead frame and a printed circuit board mounted to the lead frame;
one of the power supply components is mounted to the lead frame; and
another of the power supply components is mounted to the printed circuit board.

2. The power supply module of claim 1 wherein the package includes an epoxy resin.

3. The power supply module of claim 1 wherein one of the power supply components comprises a controller.

4. The power supply module of claim 1 wherein one of the power supply components comprises a transistor.

5. The power supply module of claim 1 wherein one of the power supply components comprises a resistor.

6. The power supply module of claim 1 wherein one of the power supply components comprises a capacitor.

7. The power supply module of claim 1 wherein the leads support the inductor body over the power supply components.

8. The power supply module of claim 1, further comprising another inductor body disposed over the power supply components.

9. The power supply module of claim 1 wherein:
the inductor body is mounted to the lead frame.

10. The power supply module of claim 1 wherein:
the inductor body is mounted to the printed circuit board.

11. A system, comprising:
a power supply module, comprising:
   a package;
   a platform having a side and disposed beneath the package;
   power supply components disposed within the package, disposed over the side of the platform, and attached to the platform;
   an inductor body disposed within the package, over the power supply components, and over the side of the platform;
   inductor leads attached to the inductor body and attached to the platform; and
   a supply output node, wherein:
      the platform includes a lead frame and a printed circuit board mounted to the lead frame;
      one of the power supply components is mounted to the lead frame; and
      another of the power supply components is mounted to the printed circuit board; and
an apparatus coupled to the supply output node.

12. The system of claim 11 wherein the apparatus comprises an integrated circuit.

13. The system of claim 12 wherein the integrated circuit comprises a processor.

14. The system of claim 12 wherein the integrated circuit comprises a memory.

15. A method, comprising:
attaching power supply components to a platform over a side of the platform;
attaching an inductor body to the platform via inductor leads, the inductor body disposed over the power supply components and over the side of the platform; and
forming a package over the inductor body, the inductor leads, the power supply components, and the platform, wherein the platform includes a lead frame, the method further comprising:
mounting a printed circuit board to the lead frame;
mounting one of the power supply components to the lead frame; and
mounting another of the power supply components to the printed circuit board.

16. The method of claim 15 wherein:
attaching the inductor body includes mounting the inductor body to the platform over the components.

17. The method of claim 15 wherein forming the package comprises encapsulating the inductor body and the power supply components in a packaging material.

18. The method of claim 15 wherein:
attaching the inductor body includes attaching multiple inductor bodies to the platform over the power supply components; and
forming the package comprises forming the package over the inductor bodies and the components.

19. A power supply module, comprising:
a platform having a side;
a package disposed over the platform;
power supply components disposed within the package and over the side of the platform; and
an inductor structure having an inductor body and inductor leads, the inductor body disposed within the package, over the power supply components, and over the side of the platform such that none of the power supply components support the inductor body, wherein:
the platform includes a lead frame and a printed circuit board mounted to the lead frame;
one of the power supply components is mounted to the lead frame; and
another of the power supply components is mounted to the printed circuit board.

* * * * *